(12) United States Patent
Hirayama et al.

(10) Patent No.: US 6,238,840 B1
(45) Date of Patent: May 29, 2001

(54) PHOTOSENSITIVE RESIN COMPOSITION

(75) Inventors: Takao Hirayama; Kuniaki Sato; Toshihiko Ito; Toshizumi Yoshino; Hiroaki Hirakura, all of Ibaraki-ken (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

(21) Appl. No.: 09/188,302

(22) Filed: Nov. 10, 1998

(30) Foreign Application Priority Data

Nov. 12, 1997 (JP) .................................................... 9-310752

(51) Int. Cl.⁷ ....................................................... G03F 7/038
(52) U.S. Cl. ........................... 430/280.1; 522/100; 522/57
(58) Field of Search .................... 430/280.1; 522/100, 522/57

(56) References Cited

U.S. PATENT DOCUMENTS 6,011,080 * 1/2000 Daley et al. ......................... 522/107

FOREIGN PATENT DOCUMENTS

| | | |
|---|---|---|
| 0419147A2 | 3/1991 | (EP) . |
| 0624824A1 | 11/1994 | (EP) . |
| 0634696A1 | 1/1995 | (EP) . |
| 0663411A1 | 7/1995 | (EP) . |

OTHER PUBLICATIONS

RN 222533–27–9, Registry, Copyright 2000, ACS, one page.*

RN 186104–75–6, Registry, Copyright 2000, ACS, one page.*

RN 93705–67–0, Registry, Copyright 2000, ACS, one page.*

* cited by examiner

*Primary Examiner*—Cynthia Hamilton
(74) *Attorney, Agent, or Firm*—Antonelli, Terry & Kraus, LLP

(57) ABSTRACT

A photosensitive resin composition comprising (A) a photosensitive resin having one or more carboxyl groups, (B) a special epoxy curing agent, and (C) a photopolymerization initiator is excellent in adhesiveness, heat resistance, resistance to PCT and developability and suitable as a solder resist composition.

12 Claims, No Drawings

PHOTOSENSITIVE RESIN COMPOSITION

BACKGROUND OF THE INVENTION

The present invention relates to a photosensitive resin composition suitable for use as a solder resist composition applicable to the manufacture of rigid and flexible printed circuit boards or LSI packages such as BGA (ball grid array), CSP (chip size package), etc.

Solder resist is used in the manufacture of printed circuit boards, and in the recent years it is used also in the field of new LSI packages such as BGA, CSP, etc. A solder resist is indispensably necessary as a protective film for protecting the solder-evading portions from adhesion of solder, or as a permanent mask. Sometimes, soldering is practiced by printing a thermosetting solder according to the screen printing process, and the present invention is applicable to such a method, too. In the recent years, however, photo solder resist method or the method of forming pattern by photography has become more prevalent, because the screen printing method is limited in resolving power and cannot cope with the trend of enhancing the density of wiring. Of the photo solder resists, alkali-development type photo solder resist which can be developed with a solution of weak alkali such as sodium carbonate and the like is predominantly used from the viewpoint of securing the working environment and earth environment. As such alkali-development type photo solder resist, those disclosed in JP-A 61-243869 and JP-A 1-141904 can be referred to. The alkali-development type photo solder resist, however, is yet unsatisfactory in durability. That is, it is inferior to prior thermosetting type or solvent development type of solder resists in chemical resistance, water resistance and heat resistance. This is for a reason that the main ingredient of an alkali-development type photo solder resist composition must be a compound having hydrophilic groups facilitating the permeation of chemical solutions, water and water vapor necessary for alkali-development, due to which adhesiveness between resist film and copper is low. Especially in semiconductor packages such as BGA, CSP, etc., a high resistance to PCT (pressure-cooker test property which may be considered as a wet heat resistance) is needed. The existing alkali-development type photo solder resist, however, can endure such a test of severe condition only for about several hours to ten-odd hours.

SUMMARY OF THE INVENTION

An object of the present invention is to solve the problems mentioned above and to provide a photosensitive resin composition suitable for use as a solder resist composition excellent in adhesiveness between a resist film and substrate made of copper or the like and in wet heat resistance.

Thus, the present invention provides a photo-sensitive resin composition comprising (A) a carboxyl group-containing photosensitive resin, (B) an epoxy curing agent represented by the following formula (I), and (C) a photo-polymerization initiator:

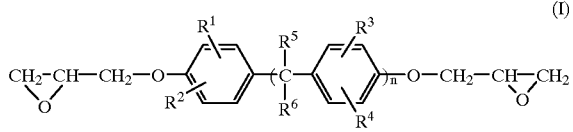

wherein $R^1$, $R^2$, $R^3$ and $R^4$ are independently a hydrogen atom, an alkyl group having 1 to 4 carbon atoms or an aryl group having 6 to 10 carbon atoms, provided that at least one of $R^1$, $R^2$, $R^3$ and $R^4$ is an alkyl group having 1 to 4 carbon atoms or an aryl group having 6 to 18 carbon atoms; $R^5$ and $R^6$ are independently a hydrogen atom or an alkyl group having 1 to 2 carbon atoms; and n is 0, 1, 2 or 3.

DETAILED DESCRIPTION OF THE INVENTION

The present inventors have conducted extensive studies with an aim of solving the problems mentioned above. As a result, it has been found that a photosensitive resin composition comprising a photosensitive resin using a specified epoxy curing agent and a photopolymerization initiator and a photosensitive resin composition further comprising a triazine compound in addition to the above-mentioned ingredients are excellent in adhesiveness to copper substrate and other substrates, and in durability. Based on this finding, the present invention has been accomplished.

The photosensitive resin composition of the present invention comprises (A) a carboxyl group-containing photosensitive resin, (B) an epoxy curing agent represented by the following formula (I), and (C) a photopolymerization initiator:

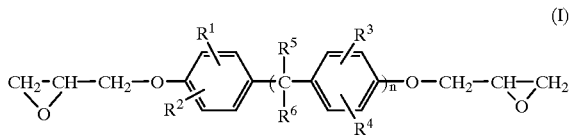

wherein $R^1$, $R^2$, $R^3$ and $R^4$ are independently a hydrogen atom, an alkyl group having 1 to 4 carbon atoms or an aryl group having 6 to 10 carbon atoms, provided that at least one of $R^1$, $R^2$, $R^3$ and $R^4$ is an alkyl group having 1 to 4 carbon atoms or an aryl group having 6 to 18 carbon atoms; $R^5$ and $R^6$ are independently a hydrogen atom or an alkyl group having 1 to 2 carbon atoms; and n is 0, 1, 2 or 3.

As the carboxyl group-containing photosensitive resin (A) used in the present invention, preferred are compounds formed by esterifying an epoxy compound (a) with an unsaturated monocarboxylic acid and then adding thereto an acid anhydride of a saturated or unsaturated polybasic acid.

As said epoxy compound (a), preferred are novolak type epoxy compounds obtained by reacting an aldehyde with phenol, cresol, halogenated phenol or alkylphenol in the presence of an acid catalyst to form a novolak and then reacting said novolak with epichlorohydrin. Commercially available articles made of such compounds (a) include YDCN-701, -704, YDPN-638 and -602 of Tohto Kasei Co., Ltd., DEN-431 and -439 of Dow Chemical Co., EPN-1259 of Ciba Geigy AG., N-730,-770,-865,-665,-673, VH-4150 and -4240 of Dainippon Ink and Chemicals Inc., EOCN-120 and BREN of Nippon Kayaku Co., Ltd., etc. Apart from the novolak type epoxy compounds, the epoxy compounds obtained by reacting salicylaldehyde with phenol or cresol and then with epichlorohydrin such as EPPN502H, FAE2500, etc. manufactured by Nippon Kayaku Co., Ltd, are also usable successfully. Further, epoxy compounds of Bisphenol A type, Bisphenol F type, hydrogenated Bisphenol A type, brominated Bisphenol A type, amino group-containing type, alicyclic type and polybutadiene modified type such as Epikote 828, 1007 and 807 of Yuka Shell Co., Epiclon 840, 860 and 3050 of Dainippon Ink and Chemicals Inc., DER-330,-337 and -361 of Dow Chemical Co., Celloxide 2021 of Daicel Chemical Industries, Ltd., TETRAD-X and -C of Mitsubishi Gas Chemical Co., Ltd., EPB-13 and -27 of Nippon Soda Co., Ltd. GY-260,-255 and XB-2615 of Ciba Geigy AG, etc. are also usable satisfactorily. Among these compounds, especially preferred are the epoxy compounds obtained by reacting salicylaldehyde with phenol or cresol and then with epichlorohydrin.

As the unsaturated monocarboxylic acid, (meth)acrylic acid (i.e. acrylic acid and methacrylic acid), crotonic acid and cinnamic acid can be referred to. Further, reaction products obtained by reacting a saturated or unsaturated polybasic acid anhydride with a (meth)-acrylate having one hydroxyl group in one molecule or with a half ester formed between a saturated or unsaturated dibasic acid and an unsaturated monoglycidyl compound can also be referred to, of which examples are reaction products obtained by reacting phthalic acid, tetrahydrophthalic acid, hexahydrophthalic acid, maleic acid or succinic acid with hydroxyethyl (meth)acrylate, hydroxypropyl (meth)acrylate, tris (hydroxyethyl) isocyanurate di(meth)acrylate or glycidyl methacrylate at an equimolar ratio in the usual manner. These unsaturated monocarboxylic acids may be used either alone or as a mixture thereof. Of these unsaturated monocarboxylic acids, preferred is acrylic acid.

As said saturated or unsaturated polybasic acid anhydride, anhydrides of phthalic acid, tetrahydrophthalic acid, hexahydrophthalic acid, maleic acid, succinic acid, trimellitic acid and the like can be used.

Acid value (KOH mg/g) of said carboxyl group-containing photosensitive resin (A) is preferably 40 to 250 and more preferably 50 to 150, from the viewpoint of balance between alkali developability and other characteristic properties such as electrical properties.

If desired, the carboxyl group-containing photo-sensitive resin (A) may be further reacted with a reaction product obtained by reacting isocyanatoethyl (meth)acrylate, tolylene diisocyanate or isophorone diisocyanate with an equimolar quantity of (meth)acrylate having at least one hydroxyl group in one molecule such as hydroxyethyl (meth)acrylate, whereby an unsaturated bond can be introduced through intermediation of a urethane linkage.

As the epoxy compound (a) used for production of the photosensitive resin (A), epoxy compounds having polyamide unit and/or polyamide-imide unit in the molecular structure thereof are also successfully usable. As examples of such epoxy compound (a), there can be referred to epoxy group-containing polyamide resins (d1) or epoxy group-containing polyamide-imide resins (d2) [hereinafter, (d1) and (d2) may be generically referred to as "epoxy group-containing polyamide(imide) resin (d)"] obtained by subjecting a polybasic carboxylic acid component such as dicarboxylic acid, tricarboxylic acid, tetracarboxylic acid dianhydride or the like and an organic diisocyanate or diamine to a condensation reaction to form a carboxyl group-terminated polyamide resin or a carboxyl group-terminated polyamideimide resin (b) [hereinafter, these resins may be generically referred to as carboxyl group-terminated polyamide(imide) resin (b)] and then reacting (b) with an epoxy resin (c) under a condition that molar ratio of the epoxy group of (c) to the carboxyl group of (b) is greater than 1.

As the polybasic carboxylic acid component which can be used in production of the carboxyl group-terminated polyamide(imide) resin (b), the following can be referred to: aliphatic dicarboxylic acids such as succinic acid, glutaric acid, adipic acid, azelaic acid, sebacic acid, decanedioic acid, dodecanedioic acid, dimer acid and the like: aromatic dicarboxylic acids such as isophthalic acid, terephthalic acid, phthalic acid, naphthalenedicarboxylic acid, diphenylsulfone-dicarboxylic acid, oxy-dibenzoic acid and the like; and aromatic carboxylic acids or anhydrides thereof such as trimellitic acid, pyromellitic acid, diphenylsulfone-tetracarboxylic dianhydride, benzophenone-dicarboxylic dianhydride and the like. These compounds may be used either alone or as a mixture thereof.

As the organic diisocyanates which can be used for production of said carboxyl group-terminated polyamide (imide) resin (b), the following can be referred to: aromatic diisocyanates such as 4,4'-diphenylmethane diisocyanate, 2,4-tolylene diisocyanate, 2,6-tolylene diisocyanate, 1,5-naphthalene diisocyanate, 3,3'-dimethyl-4,4'-diphenylmethane diisocyanate, p-phenylene diisocyanate, m-xylene diisocyanate, m-tetramethylxylene diisocyanate and the like; and aliphatic isocyanates such as hexamethylene diisocyanate, 2,2,4-trimethylhexamethylene diisocyanate, isophorone diisocyanate, 4,4'-dicyclohexylmethane diisocyanate, trans-cyclohexane-1,4-diisocyanate, hydrogenated m-xylene diisocyanate, lysine diisocyanate and the like. Of these diisocyanate compounds, aromatic diisocyanates are preferable from the viewpoint of heat resistance, and 4,4'-diphenylmethane diisocyanate and tolylene diisocyanate are especially preferable. Although these diisocyanate compounds may be used alone, a combined use of two or more diisocyanate compounds is further preferable because crystallinity can be improved thereby.

If desired, diamines may be used in place of said organic diisocyanates. As said diamine, phenylenediamine, diaminodiphenylpropane, diaminodiphenylmethane, benzidine, 4,4'-diaminodiphenyl sulfone, 4,4'-diaminodiphenyl sulfide, diaminodiphenyl ether and the like can be referred to. The use of the following diamines is preferable from the viewpoint of enhancing the solubility in organic solvents: 2,2-bis(3-aminophenoxyphenyl)propane, 2,2-bis(4-aminophenoxyphenyl)propane, 3,3'-bis(3-aminophenoxyphenyl) sulfone, 4,4'-bis(3-aminophenoxyphenyl) sulfone, 3,3'-bis(4-aminophenoxyphenyl) sulfone, 4,4'-bis(4-aminophenoxyphenyl) sulfone, 2,2-bis(3-aminophenoxyphenyl)-hexafluoropropane, 2,2-bis(4-aminophenoxyphenyl)-hexafluoropropane, 1,4-bis(4-aminophenoxy)benzene, 1,3-bis(4-aminophenoxy)-benzene, 4,4-(p-phenylene-diisopropylidene)-bisaniline, 4,4-m-phenylene-diisopropylidene)-bisaniline and the like.

Although these organic diisocyanates and diamines may be used alone, a combined use of two or more of them is also allowable, provided that a simultaneous use of anorganic diisocyanate and a diamine is undesirable because a diisocyanate and a diamine can react each other to form a urea linkage inferior in heat resistance.

As the carboxyl group-terminated polyamide(imide) resin (b), resins having at least one polymer unit selected from polyalkylene oxide unit and polycarbonate unit in molecular structure are preferably used. The polyalkylene oxide unit and polycarbonate unit are introduced into the polyamide (imide) skeleton by using a dicarboxylic acid prepared by introducing carboxyl groups into both terminals of polyalkylene glycol or polycarbonate diol as a polybasic carboxylic acid component and reacting it with a diisocyanate or a diamine at the time of producing the carboxyl group-terminated polyamide(imide) resin (b). As said polyalkylene glycol, polytetramethylene ether glycol, polypropylene glycol, polyethylene glycol, or reaction products obtained by reacting these polyalkylene glycols with bisphenol A or hydrogenated bisphenol A can be referred to. Two or more kinds of polyalkylene oxide units may be introduced into one molecule in the above-mentioned manner. As said polycarbonate diol, straight chained aliphatic polycarbonate diols can be referred to, of which commercially available examples include Plaxel CD series manufactured by Daicel Chemical Industries, Ltd., Nippolan 980 and 981 manufactured by Nippon Polyurethane Co., etc.

For preparing a both-terminal carboxylic acid by introducing a carboxyl group into both molecular ends of polyalkylene glycol or polycarbonate diol, it is advisable to react a polybasic acid such as the above-mentioned polybasic acid component, preferably a dicarboxylic acid, with a polyalkylene glycol or a polycarbonate diol.

Further, polyalkylene glycol diamines having amino groups introduced into molecular ends thereof and polycarbonate diamines having amino groups introduced into molecular ends thereof can also be used as a diamine component to be introduced into a carboxyl group-terminated polyamide(imide) resin (b), and imidodicarboxylic acids prepared by reacting these diamine components with trimellitic acid can also be used as polybasic carboxylic acid components to be introduced into a carboxyl group-terminated polyamide(imide) resin (b).

The total content of the polyalkylene oxide unit or polycarbonate unit is preferably no less than 10% by weight from the viewpoint of adhesiveness and preferably no more than 90% by weight from the viewpoint of heat resistance, both based on the carboxyl group-terminated polyamide(imide) resin (b). Further, from the viewpoint of adhesiveness and resistance to water absorption, it is preferable to introduce these units by the use of polytetramethylene ether glycol, polypropylene glycol or their reaction products with (hydrogenated) bisphenol A. Molecular weight of these usable diols is preferably 200 to 4,000, as calculated from hydroxyl value.

In the production of the carboxyl group-terminated polyamide(imide) resin (b), the polybasic carboxylic acid component is compounded with a diisocyanate component and a diamine component so that molar ratio of polybasic acid component to the sum of diisocyanate component and diamine component falls in the range of from 1 to 3, and further preferably from 1.1 to 2.2, and the compounded mixture is made to react.

The reaction mentioned above is carried out at a temperature of 50° C. to 250° C. in a lactone solvent such as γ-butyrolactone or the like, an amide solvent such as N-methylpyrrolidone (NMP), dimethylformamide (DMF) or the like, a sulfone solvent such as tetramethylene sulfone or the like, or an ethereal solvent such as diethylene glycol dimethyl ether or the like. If product yield of the reaction, solubility and volatility in the post treatment are taken into consideration, it is advisable to use γ-butyrolactone as a main ingredient of the solvent.

As the epoxy resin (c) to be reacted with the carboxyl group-terminated polyamide(imide) resin (b), the following can be referred to: aromatic epoxy resins such as bisphenol A type epoxy resins, bisphenol F type epoxy resins, bisphenol S type epoxy resins, phenol-novolak type epoxy resins, cresol-novolak type epoxy resins, naphthalene type epoxy resins and modified products thereof, bixylenyl diglycidyl ether, YDC 1312 (trade name of a product manufactured by Tohto Kasei Co., Ltd.), Techmore VG 3101 (trade name of a product manufactured by Mitsui Petro-chemical Industries, Ltd.), TMH 574 (trade name of a product manufactured by Sumitomo Chemical Co., Ltd.), ESLV-80XY, -90CR, -120TE and -80DE (trade names of products manufactured by Nippon Steel Chemical Co., Ltd.), Epikote 1031S (trade name of a product manufactured by Yuka Shell Co., Ltd.) and the like; aliphatic epoxy resins such as neopentyl glycol diglycidyl ether, propylene glycol diglycidyl ether, diglycidyl tetrahydrophthalate and the like; and heterocyclic epoxy compounds such as triglycidyl isocyanurate and the like. Among these epoxy compounds, ifunctional epoxy resins are preferable from the viewpoint of reaction-controllability, and aromatic and heterocyclic epoxy resins are preferable from the viewpoint of heat resistance. For giving the composition a flame retardancy, brominated epoxy resins are useful. These epoxy resins can be used either alone or as a mixture thereof. These epoxy resins (c) are reacted with a carboxyl group-terminated polyamide(imide) resin (b) under a condition that the molar ratio of epoxy group of (c) to carboxyl group of (b) is greater than 1 and preferably in the range of 1.1 to 2.5. If the epoxy group/carboxyl group molar ratio is not greater than 1, there can be obtained no resin with epoxy group introduced into molecular chain terminal thereof. The epoxy group-containing polyamide(imide) resin (d) thus obtained preferably has an epoxy equivalent of 500 to 40,000. If the epoxy equivalent is smaller than 500, molecular weight is too low and the resin is inferior in adhesion property. If the epoxy equivalent is greater than 40,000, molecular weight is too high and the resin is inferior in developability.

Preferably, the epoxy group-containing polyamide-(imide) resin (d) is reacted with an unsaturated monocarboxylic acid under a condition that molar ratio of the carboxyl group of the unsaturated monocarboxylic acid to epoxy group of (d) is in the range of from 0.5 to 2.

If desired, the epoxy group-containing polyamide-(imide) resin (d) may be further reacted with isocyanatoethyl (meth)acrylate or with a reaction product prepared by reacting one mole of tolylene diisocyanate or isophorone diisocyanate with one mole of (meth)acrylate having one or more hydroxyl groups in one molecule such as hydroxyethyl (meth)acrylate or the like to introduce an unsaturated bond into the hydroxyl group remaining in the resin through intermediation of a urethane linkage, with consideration of photosensitivity characteristics.

Preferably, an acid anhydride of a saturated or unsaturated polybasic acid such as phthalic acid, tetrahydrophthalic acid, hexahydrophthalic acid, maleic acid, succinic acid, trimellitic acid or the like is added to the esterified product formed between the epoxy group-containing polyamide(imide) resin (d) and the unsaturated monocarboxylic acid. When a further enhanced acid value is desired, it is also allowable to react the product obtained above further with glycidol and then with a polybasic acid anhydride.

Acid value of the carboxyl group-containing photosensitive resin (A) should preferably be in the range of from 40 to 250, and further preferably in the range of from 50 to 150, if the balance between alkali developability and other characteristic properties such as electrical property is taken into consideration.

As the carboxyl group-containing photosensitive resin (A), acrylic or styrene type resins having carboxyl group and (meth)acrylate group such as those disclosed in JP-B 7-92603 and JP-A 63-205649, these references being hereby incorporated by reference, may also be used instead of the above-mentioned resin.

In the photosensitive resin composition of the present invention, the content of the photosensitive resin (A) is preferably in the range of from 10% to 90% by weight.

Next, as the epoxy curing agent (B) used in the present invention, those represented by the following formula (I) can be referred to:

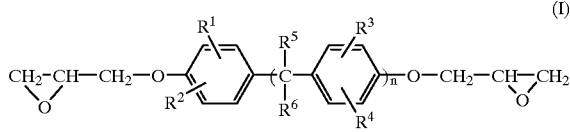

(I)

wherein $R^1$, $R^2$, $R^3$ and $R^4$ are independently a hydrogen atom, an alkyl group having 1 to 4 carbon atoms or an aryl group having 6 to 10 carbon atoms, provided that at least one of $R^1$, $R^2$, $R^3$ and $R^4$ is an alkyl group having 1 to 4 carbon atoms or an aryl group having 6 to 18 carbon atoms e.g. a phenyl group, a naphthyl group, etc., which may be substituted with one or more alkyl groups having 1 to 3 carbon atoms, one or more alkoxy groups having 1 to 3 carbon atoms or one or more halogen atoms (e.g. Cl, I, Br, F); $R^5$ and $R^6$ are independently a hydrogen atom or an alkyl group having 1 to 2 carbon atoms; and n is 0, 1, 2 or 3. As specific examples of $R^1$, $R^2$, $R^3$ and $R^4$, a methyl group, a t-butyl group, a phenyl group and the like can be referred to.

As specific examples of the epoxy curing agent (B) usable in the present invention, YDC 1312 manufactured by Tohto Kasei Co., Ltd, can be referred to as an example in which n is 0, ESLV-80XY manufactured by Nippon Steel Chemical Co., Ltd. can be referred to as an example in which n is 1, and ESLV-9° C.R manufactured by Nippon Steel Chemical Co., Ltd. can be referred to as an example in which n is 2. Further, bisphenol F type epoxy resins are also usable for this purpose. All these epoxy curing agents have a solubility of 2 or more grams in 10 g of Carbitol Acetate/Solvesso 150 mixture (1/1 by weight) which is a typical solvent for resists, making contrast to the bixylenol type epoxy resin (YX 4000, manufactured by Yuka Shell Co., Ltd.) of which solubility in the same solvent as above is only 1 g. In spite of such high solubility, these curing agents are good in sensitivity and developability, and satisfy the requirements concerning the properties which a package resist must have, such as PCT-resistance, thermocycle resistance, etc. Compounds in which n is 4 or greater are undesirable, because epoxy equivalent is too great and heat resistance is not good. Among these compounds, ESLV-80XY in which n is 1 is further preferred.

If desired, a part (50% by weight or less) of the above-mentioned epoxy curing agent (B) may be replaced by other epoxy curing agents. Said "other epoxy curing agents" may have a photosensitive group or no photosensitive group.

As the epoxy curing agent having a photosensitive group, the aforementioned epoxy acrylate compound which has been prepared by esterifying a novolak type epoxy compound with an unsaturated monocarboxylic acid and is not yet converted to a carboxyl group-containing photosensitive resin (A) through addition of an acid anhydride is successfully usable. Further, urethane compounds prepared by introducing isocyanatoethyl methacrylate or the like into said epoxy acrylate compound through intermediation of a urethane linkage are also usable successfully.

As the epoxy curing agent having no photosensitive group, epoxy resins having two or more epoxy groups in one molecule are preferable, and specific examples thereof include glycidyl ether type epoxy resins such as bisphenol A type epoxy resin, bisphenol S type epoxy resin and brominated derivatives thereof, phenol or cresol novolak type epoxy resins, bisphenyl type epoxy resins [for example, YX 4000 (trade name of a product manufactured by Yuka Shell Epoxy Co., Ltd.)], and special glycidyl ether type epoxy resins [for example, TACTIX 742 (trade name of a product manufactured by Dow Chemical Co., Ltd.), ZX 1257 (trade name of a product manufactured by Tohto Kasei Co., Ltd.), ESLV-120TE and -80DE (trade names of products manufactured by Nippon Steel Chemical Co., Ltd.)]; and special epoxy resins such as glycidyl ester type epoxy resins [for example, Denacol EX711 (trade name of a product manufactured by Nagase Kasei Kogyo Co., Ltd.)], glycidylamine type epoxy resins [for example, YH 434 (trade name of a product manufactured by Tohto Kasei Co., Ltd.], naphthalene type epoxy resins [for example, Epiclon HP-4032 (trade name of a product manufactured by Dainippon Ink and Chemicals, Inc.], dicyclo type epoxy resins [for example, Epiclon HP7200H (trade name of a product manufactured by Dainippon Ink and Chemicals, Inc.], cycloaliphatic epoxy resins, heterocyclic epoxy resins, hydantoin type epoxy resins, triglycidyl isocyanurate and the like.

The epoxy curing agent is compounded into the composition preferably in an amount of 0.1 to 40% by weight, and more preferably in an amount of 1 to 30% by weight. If the amount of the epoxy curing agent is less than 0.1% by weight, there is a tendency that the composition cannot cure sufficiently. If the amount of the epoxy curing agent exceeds 40% by weight, there is a tendency that photosensitive characteristics are not good.

As the photopolymerization initiator (C) which can be used in the present invention, the following can be referred to: benzoins such as benzoin, benzoin methyl ether, benzoin isopropyl ether and the like; acetophenones such as acetophenone, 2,2-dimethoxy-2-phenylacetophenone, 2,2-diethoxy-2-phenylacetophenone, 1,1-dichloroacetophenone, 1-hydroxycyclohexyl phenyl ketone, 2-methyl-1-[4-(methylthio)-phenyl]-2-morpholinopropane-1-one, 2,2-diethoxyacetophenone, N,N-dimethylaminoacetophenone and the like; anthraquinones such as 2-methylanthraquinone, 2-ethylanthraquinone, 2-tert-butylanthraquinone, 1-chloroanthraquinone, 2-amyl-anthraquinone, 2-aminoanthraquinone and the like; thioxanthones such as 2,4-dimethylthioxanthone, 2,4-diethylthioxanthone, 2-chlorothioxanthone, 2,4-diisopropylthioxanthone and the like; ketals such as acetophenone dimethyl ketal, benzil dimethyl ketal and the like; benzophenones such as benzophenone, methylbenzophenone, 4,4'-dichlorobenzophenone, 4,4'-bis(diethylamine) benzophenone, Michler's ketone, 4-benzoyl-4'-methyldiphenyl sulfide and the like; 2,4,5-triarylimidazole dimers such as 2-(o-chlorophenyl)-4,5-diphenylimidazole dimer, 2-(o-chlorophenyl)-4,5-di(m-methoxyphenyl) imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di (p-methoxyphenyl)-5-phenylimidazole dimer, 2-(2,4-dimethoxyphenyl)-4,5-diphenylimidazole dimer and the like; acridine derivatives such as 9-phenylacridine, 1,7-bis (9,9'-acridinyl)heptane and the like; 2,4,6-trimethylbenzoyl diphenyl phosphine oxide; and the like. These compounds may be used either alone or as a mixture thereof. The amount of the photopolymerization initiator (C) to be compounded into the photosensitive resin composition is preferably 0.1 to 20% by weight and more preferably 1 to 10% by weight based on the composition.

If desired, a photopolymerization initiating assistant may be compounded into the photosensitive resin composition of the present invention. As said photopolymerization initiating assistant, tertiary amines such as ethyl N,N-dimethylaminobenzoate, isoamyl N,N-dimethylaminobenzoate, pentyl-4-dimethylaminobenzoate, dimethylethanolamine, triethylamine, triethanolamine and the like can be referred to. These photopolymerization initiating assistants, which may be used either alone or in the form of mixture, can be incorporated into the photosensitive resin composition preferably in an amount of 0.1 to 20% by weight based on the composition.

As the triazine compound (D) which can be used in the present invention, melamine, acetoguanamine, benzoguanamine, melamine-phenol formaldehyde resin, ethyldiamino-s-triazine, 2,4-diamino-s-triazine, 2,4-diamine-6-xylyl-s-triazine and the like can be referred to. Any compounds having a triazine ring may be used as said triazine compound (D) without restriction. As commercially available triazine compound, 2MZ-AZINE, 2E4MZ-AZINE and C11Z-AZINE represented by the following formulas, all manufactured by Shikoku Chemicals Corp., can be referred to:

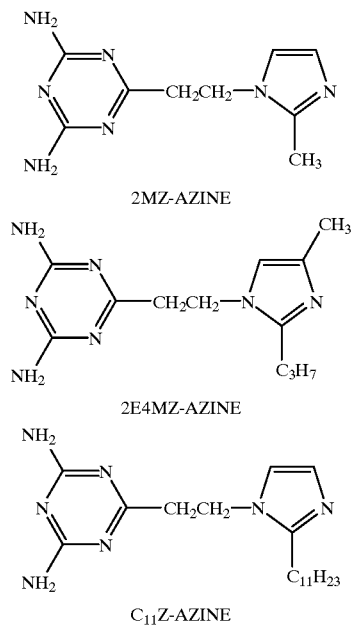

2MZ-AZINE

2E4MZ-AZINE

C11Z-AZINE

These compounds improve the adhesiveness to copper circuit and resistance to PCT and exercise a positive effect on resistance to electrolytic corrosion. These triazine compounds (D) may be used either alone or as a mixture thereof, preferably in an amount of 0.1 to 40% by weight and more preferably in an amount of 0.1 to 20% by weight based on the photosensitive resin composition.

In addition to the above-mentioned ingredients, other curing agents and heat curing accelerators may be added according to the need. Said "other curing agents" include boron trifluoride-amine complexes, dicyandiamide, organic acid hydrazides, diaminomaleonitrile, urea, alkylated melamine resins such as hexamethoxymethylated melamine and the like, polyamine salts, aromatic amines such as diaminodiphenylmethane, m-phenylenediamine, m-xylylene-diamine, diaminodiphenyl sulfone, Hardener HT972 (trade name of a product manufactured by Ciba Geigy AG) and the like; aromatic acid anhydrides such as phthalic anhydride, trimellitic anhydride, ethyleneglycol-bis (anhydro-trimellitate), glycerol-tris(anhydrotrimellitate), benzophenone-tetracarboxylic acid anhydride and the like; aliphatic acid anhydrides such as maleic anhydride, tetrahydrophthalic anhydride and the like; and polyphenols such as polyvinylphenol, polyvinylphenol bromide, phenol novolak, alkylphenol novolak and the like. Said heat curing accelerators include metallic salts of acetylacetone such as Zn acetylacetonate and the like; enamine; tin octanoate; quarternary phosphonium salts; tertiary phosphines such as triphenylphosphine and the like; phosphonium salts such as tri-n-butyl(2,5-dihydroxyphenyl)phosphonium bromide, hexadecyltributylphosphonium chloride and the like; quaternary ammonium salts such as benzyltrimethylammonium chloride, phenyltributylammonium chloride and the like; poloates and antimonates such as diphenyliodonium tetrafluoropoloate, triphenylsulfonium hexafluoro-antimonate and the like; tertiary amines such as dimethylbenzylamine, 1,8-diazabicyclo[5,4,0]undecene, m-aminophenol, 2,4,6-tris(dimethylaminophenol), tetramethyl-guanidine and the like; and imidazoles such as 2-ethyl-4-methylimidazole, 2-methylimidazole, 1-benzyl-2-methyl-imidazole, 2-phenylimidazole, 2-phenyl-4-methyl-5-hydroxy-methylimidazole and the like. These heat curing accelerators are used either alone or in the form of mixture. The above-mentioned "other curing agents" and the heat curing accelerators are preferably used each in an amount of 0.01 to 10% by weight based on the photo-sensitive resin composition.

According to the need, various photosensitive monomers may be added to the photosensitive resin composition of the present invention for the purpose of improving photosensitivity and other characteristic properties. For instance, photopolymerizable monomers such as 2-hydroxyethyl (meth) acrylate, trimethylolpropane tri(meth)acrylate, pentaerythritol tri(meth)acrylate, dipentaerythritol hexa (meth)acrylate, N,N-dimethyl (meth)acrylate, N-methylol (meth)acrylamide, urethane (meth)acrylate; mono- and polyfunctional (meth)acrylates of polyethylene glycol, polypropylene glycol, reaction product formed between bisphenol A and polyethylene glycol or polypropylene glycol, tris(2-hydroxyethyl) isocyanurate and the like; (meth)acrylates of glycidyl ethers such as triglycidyl isocyanurate and the like; diallyl phthalate; and the like can be used as said photosensitive monomer. These monomers can be used either alone or in the form of a mixture. Each photosensitive monomer is used preferably in an amount of 0.1 to 30% by weight based on the photosensitive resin composition.

According to the need, the photosensitive resin composition of the present invention may be diluted with an organic solvent. For instance, ketones such as ethyl methyl ketone, cyclohexanone and the like; aromatic hydrocarbons such as toluene, xylene and the like; glycol ethers such as methyl Cellosolve, butyl Cellosolve, methyl carbitol, butyl carbitol, propylene glycol monomethyl ether, dipropylene glycol monoethyl ether, triethylene glycol monoethyl ether and the like; esters such as ethyl acetate, butyl acetate, butyl Cellosolve acetate, carbitol acetate and the like; alcohols such as ethanol, propanol, ethylene glycol, propylene glycol and the like; aliphatic hydrocarbons such as octane, decane and the like; petrolic solvents such as petroleum ether, petroleum naphtha, hydrogenated petroleum naphtha, solvent naphtha and the like, etc. can be used for this purpose.

According to the need, an inorganic filler such as barium sulfate, barium titanate, powdery silicone oxide, amorphous silica, talc, clay, calcined kaolin, magnesium carbonate, calcium carbonate, aluminum oxide, aluminum hydroxide, powdered mica and the like may be incorporated into the photosensitive resin composition of the present invention for the purpose of improving adhesion properties, hardness, and other properties. A preferred amount of the inorganic filler is 0 to 60% by weight. Further, if desired, colorants such as Phthalocyanine Blue, Phthalocyanine Green, Iodine Green, Disazo Yellow, Crystal Violet, titanium oxide, carbon black, Naphthalene Black and the like can also be used. Further, other additives can also be used. Examples of said additives include polymerization inhibitor such as hydroquinone, hydroquinone monomethyl ether, tert-butyl catechol, pyrrogallol, phenothiazine and the like; thixotropic agent such as bentone, montmorillonite, aerosil, amide wax and the like; silicone type, fluoride type and polymeric antifoaming agents; levelling agent; and adhesiveness improver such as imidazole compounds, thiazole compounds, triazole compounds, silane coupler and the like.

The photosensitive resin composition of the present invention is prepared by compounding the ingredients mentioned above in the proportion mentioned above and homogenizing the compounded mixture with roll mill, beads mill or the like. The composition thus obtained can be cured in the following manner, for instance. Thus, a printed circuit board or the like is coated with the composition of the present invention up to a coating film thickness of 10 to 160 μm by screen printing process, spraying process, electrostatic spraying process, airless spraying process, curtain coater process, roll coat process or the like, and the coating film is dried at 60 to 110° C. Then, a negative film is laid on the coating film, and a radiation such as ultraviolet ray is irradiated. Subsequently, the unexposed area is dissolved off (development) with a dilute aqueous alkali solution such as an aqueous sodium carbonate solution having a concentration of 0.5 to 2% by weight, and the undissolved area is sufficiently cured by means of ultraviolet irradiation and/or heating at 100 to 200° C. for 0.5 to 1.0 hour to form a cured film.

The photosensitive resin composition of the present invention is useful as a solder resist for printed circuit board and package such as BGA, CSP, etc. The composition of the present invention can also be used as a coating material for glass, ceramics, plastics, paper, etc.

Next, the present invention is explained in more detail by referring to Examples. The invention is by no means limited by these Examples.

EXAMPLE OF PRODUCTION OF CARBOXYL GROUP-CONTAINING PHOTOSENSITIVE RESIN (A-1)

A flask equipped with a stirrer, a reflux condenser and a thermometer was charged with 55.7 parts by weight of a salicylaldehyde-phenol type epoxy resin having an epoxy equivalent of 168, 24.1 parts by weight of acrylic acid, 0.1 part by weight of methylhydroquinone, 26 parts by weight of carbitol acetate and 17 parts by weight of solvent naphtha (Solvesso 150), and the charged mixture was dissolved with heating and stirring at 70° C. The resulting solution was cooled to 50° C., and then 1 part by weight of triphenylphosphine was added and heated at 100° C. to make progress a reaction until acid value of the solid component reached 1 (KOH mg/g) or less. The resulting solution was cooled to 50° C., to which were added 20.3 parts by weight of tetrahydrophthalic anhydride, 5 parts by weight of carbitol acetate and 4 parts by weight of solvent naphtha. The mixture was reacted at 80° C. for a predetermined period of time to obtain an unsaturated group-containing polycarboxylic acid resin (A-1) having a solid content of 67% by weight, in which the solid component had an acid value of 80 (KOH mg/g).

EXAMPLE OF PRODUCTION OF CARBOXYL GROUP-CONTAINING PHOTOSENSITIVE RESIN (A-2)

A flask equipped with a stirrer, a reflux condenser and a thermometer was charged with 200 parts by weight of a cresol-novolak type epoxy resin having an epoxy equivalent of 200, 70 parts by weight of acrylic acid, 0.4 part by weight of methylhydroquinone, 80 parts by weight of carbitol acetate and 20 parts by weight of solvent naphtha, and the charged mixture was dissolved with heating and stirring at 70° C. The resulting solution was cooled to 50° C., and then 1 part by weight of triphenylphosphine was added and heated at 100° C. to make progress a reaction until acid value of the solid component reached 1 (KOH mg/g) or less. The resulting solution was cooled to 50° C., to which were added 51 parts by weight of maleic anhydride, 48 parts by weight of carbitol acetate and 10 parts by weight of solvent naphtha. The mixture was reacted at 80° C. for a predetermined period of time to obtain an unsaturated group-containing polycarboxylic acid resin (A-2) having a solid content of 67% by weight, in which the solid component had an acid value of 67 (KOH mg/g).

EXAMPLE OF PRODUCTION OF BOTH TERMINALS-CARBOXYLATED POLYTETRAMETHYLENE ETHER GLYCOL (PTG) (B-1)

A flask equipped with a stirrer, a reflex condenser, an inert gas inlet tube and a thermometer was charged with 1,000 g of PTG having an average molecular weight of 1,000 and 405 g of sebacic acid. The content of the flask was heated up to 200° C. in 2 hours, reacted for 3 hours at that temperature and then cooled to obtain a both terminals-carboxylated PTG, namely a PTG having an acid value of 81.9 and a molecular weight of 1,370 with carboxyl groups introduced into both molecular terminals.

In the same manner as above, a both terminals-carboxylated product (B-2) of a both terminals-diamine of polypropylene glycol, namely a both terminals-carboxylated product of a both terminals diamine of a polypropylene glycol with amino groups introduced into both molecular terminals (PPG-NH$_2$, average molecular weight 900), was prepared according to the compounding ratio shown in Table 1.

Further in the same manner as above, a both terminals-carboxylated product (B-3) of a bisphenol A/polypropylene glycol reaction product (Bis-PPG, average molecular weight 1,450) was prepared according to the compounding ratio shown in Table 1.

Further, in the same manner as above, a both terminals-carboxylated product of a polycarbonate-diol (Plaxel CD220; average molecular weight 2,000; manufactured by Daicel Chemical Industries, Ltd.) was obtained according to the compounding ratio shown in Table 1.

Characteristic properties of the both terminals-carboxylated products obtained above are summarized in Table 1.

TABLE 1

|  | B-1 | B-2 | B-3 | B-4 |
|---|---|---|---|---|
| Compounding ratio |  |  |  |  |
| PTG (Molecular weight 1,000) | 1,000 g |  |  |  |
| PPG-NH$_2$ (Molecular weight 900) |  | 900 g |  |  |
| Bis-PPG (Molecular weight 1,450) |  |  | 1,450 g |  |
| Plaxel CD220 (Molecular |  |  |  | 2,000 g |

TABLE 1-continued

|  | B-1 | B-2 | B-3 | B-4 |
|---|---|---|---|---|
| weight 2,000) |  |  |  |  |
| Adipic acid |  |  | 292 g |  |
| Sebacic acid | 405 g |  |  | 405 g |
| Trimellitic anhydride |  | 384 g |  |  |
| Characteristics |  |  |  |  |
| Acid value | 81.9 | 90.4 | 65.7 | 46.7 |
| Molecular weight | 1,370 | 1,240 | 1,706 | 2,400 |

EXAMPLES OF PRODUCTION OF PHOTOSENSITIVE POLYAMIDE RESIN (C-1)

A flask equipped with a stirrer, a reflux condenser, an inert gas inlet tube and a thermometer was charged with 100 g of 7-butyrolactone and 50 g of NMP and further with 55.6 g of (B-1) obtained above, 6.1 g of adipic acid, 8.3 g of sebacic acid, 13.7 g of isophthalic acid, 13.8 g of 4,4'-diphenylmethane diisocyanate (MDI) and 14.4 g of Colonate T80 (tolylene diisocyanate, TDI, manufactured by Nippon Polyurethane Kogyo Co.). The content of the flask was heated to 200° C., kept at that temperature for 4 hours and then cooled to obtain a polyamide resin having an acid value (measured on solid component) of 83.5 and giving a residue upon heating of 40% by weight. Subsequently, 141.5 g of Epikote 1001 (bisphenol A type epoxy resin, manufactured by Yuka Shell Co.) was added, and the resulting mixture was kept at 140° C. for 2 hours, cooled, and diluted with dimethylformamide (DMF) in an amount just giving a residue upon heating of 40% by weight. Subsequently, 10.7 g of acrylic acid was added at 120° C. and the resulting mixture was kept at that temperature for 3 hours, after which 90.6 g of tetrahydrophthalic anhydride (THPA) and the resulting mixture was kept at that temperature for one hour. Then, 58.4 g of glycidol was added and the resulting mixture was kept hot for 2 hours, after which 240 g of THPA was added and the resulting mixture was kept hot for 2 hours. The mixture thus obtained was diluted with DMF to prepare a photosensitive polyamide resin (C-1). Acid value of the solid component of the resin (C-1) was 145, and resin (C-1) gave a residue upon heating of 55% by weight.

EXAMPLE OF PRODUCTION OF PHOTOSENSITIVE POLYAMIDE-IMIDE Resin (C-2)

A flask equipped with a stirrer, a reflux condenser, an inert gas inlet tube and a thermometer was charged with 50 g of NMP, and further with 12.4 g (0.030 mol) of 2,2-bis(4-aminophenoxyphenyl)-propane (hereinafter referred to as BAPP) and 11.6 g (0.060 mol) of trimellitic anhydride. The content of the flask was kept at 200° C. for 2.5 hours. Thereto were added 41.0 g (0.033 mol) of (B-2) obtained above, 4.3 g (0.029 mol) of adipic acid, 5.9 g (0.029 mol) of sebacic acid, 4.9 g (0.029 mol) of isophthalic acid, 18.9 g (0.075 mol) of 4,4'-diphenylmethane diisocyanate (MDI), 8.8 g (0.050 mol) of Colonate T80 (tolylene diisocyanate, manufactured by Nippon Poly-urethane Kogyo Co.) and 100 g of γ-butyrolactone. The resulting mixture was heated to 200° C., kept at that temperature for 4 hours, and cooled to obtain a polyamide-imide resin having an acid value (measured on solid component) of 32.8 and giving a residue upon heating of 40% by weight. Subsequently, 66.8 g of Epikote 1001 (bisphenol A type epoxy resin) was added, provided that the amount of the epoxy resin was twice that of carboxyl group. The resulting mixture was kept at 140° C. for 2 hours and then diluted with DMF in an amount giving a residue upon heating of 40% by weight. Subsequently, 5.0 g of acrylic acid was added at 120° C. and the resulting mixture was kept at that temperature for 3 hours, after which 42.9 g of THPA was added and the resulting mixture was kept hot for one hour. Finally, the mixture was diluted with DMF. Thus, a photosensitive polyamide-imide resin (B-2) was obtained. Acid value of the resin (B-2) (measured on solid component) was 85, and the resin (B-2) gave a residue upon heating of 55% by weight.

In the same manner as above, polyamide(imide) resins C-3 and C-4 were prepared according to the compounding ratios (unit: gram) shown in Table 2.

TABLE 2

| Starting materials (g) |  | C-1 | C-2 | C-3 | C-4 |
|---|---|---|---|---|---|
| *Polyamide(imide) formulation | B-1 | 55.6 |  |  |  |
|  | B-2 |  | 41.0 |  |  |
|  | B-3 |  |  | 52.8 |  |
|  | B-4 |  |  |  | 55.5 |
|  | Adipic acid | 6.1 | 4.3 | 5.8 | 5.6 |
|  | Sebacid acid | 8.3 | 5.9 | 7.9 | 7.8 |
|  | Isophthalic acid | 13.7 | 4.9 | 19.8 | 12.8 |
|  | Trimellitic anhydride |  | 11.6 |  |  |
|  | BAPP |  | 12.4 |  |  |
|  | MDI | 13.8 | 18.9 | 11.5 | 20.9 |
|  | TDI | 14.4 | 8.6 | 12.1 | 9.7 |
|  | COOH/NCO | 1.5 | — | 2.0 | 1.27 |
|  | Acid value | 83.5 | 32.8 | 128.8 | 48.9 |
| Epoxy | EPOMIK R140** |  |  | 76.2 |  |
|  | EPIKOTE 1001 | 141.5 | 66.8 |  | 82.8 |
|  | Epoxy/COOH | 2.0 | 2.0 | 1.7 | 2.0 |
| Acid added | Acrylic acid | 10.7 | 5.0 | 14.0 | 6.0 |
|  | THPA | 90.6 | 42.9 | 61.7 | 53.0 |
|  | Glycidol | 58.4 |  |  |  |
|  | THPA | 240 |  |  |  |
| Characteristic properties | Residue upon heating (% by weight) | 55 | 55 | 55 | 55 |
|  | Acid value of solid component | 145 | 85 | 102 | 95 |

*Polyamide(imide) formulation: Amounts of compounded ingredients per 100 yield
**Bisphenol A type epoxy resin, manufactured by Mitsui Petrochemical Industries, Ltd.

EXAMPLE OF PRODUCTION OF RESIN HAVING ACRYLATE GROUP AND EPOXY GROUP (D-1)

A flask equipped with a stirrer, a reflux condenser and a thermometer was charged with 200 parts by weight of a cresol-novolak type epoxy resin having an epoxy equivalent of 200, 20 parts by weight of acrylic acid, 0.4 part by weight of methylhydroquinone, 80 parts by weight of carbitol acetate and 20 parts by weight of solvent naphtha. The content of the flask was heated at 70° C. with stirring to make a uniform solution. Then, the solution was cooled to 50° C., 0.5 part by weight of triphenylphosphine was added, and the resulting mixture was heated to 100° C. and reacted until acid value of the solid component reached 1 (KOH mg/g) or less. By diluting the reaction product with 10 parts by weight of solvent naphtha, resin (D-1) having a solid component content of 67% by weight was obtained.

EXAMPLES 1–5 AND COMPARATIVE EXAMPLES 1–2

Resist ink compositions were prepared according to the compounding ratios shown in Table 3. Thus, ingredients A and B were separately kneaded by means of triple roll, and then 70 g of A was mixed with 30 g of B to give each resist ink composition. According to the screen printing process, each resist ink composition was coated onto a copper-clad laminate board through a 100 mesh polyester screen, so as to give a film thickness after dried of 25 to 35 μm. After drying the coated film at 80° C. for 20 minutes, a negative mask film having a resist pattern was tightly contacted, and an ultraviolet ray was irradiated for a predetermined period of time by means of an ultraviolet exposing apparatus. Subsequently, a spray-development was carried out with 1% aqueous solution of sodium carbonate for 60 seconds under a spraying pressure of 2.0 kg/cm² to dissolve and eliminate the unexposed area, and the develop-ability was evaluated.

Subsequently, the film was heat-cured at 150° C. for one hour by means of a hot air circulation oven, and the cured film thus obtained was evaluated.

Further, the tests of Examples 2, 3, 4 and 5 and Comparative Examples 1 and 2 were carried out according to the compounding ratios shown in Table 3, in the same manner as in Example 1. The results of these tests are shown in Table 4.

TABLE 3

| | | Example | | | | | Comparative Example | |
|---|---|---|---|---|---|---|---|---|
| Materials (parts by weight) | | 1 | 2 | 3 | 4 | 5 | 1 | 2 |
| A | Photosensitive resin (A-1) | 70 | | 55 | 48 | 33 | 70 | |
| | Photosensitive resin (A-2) | | | | | | | 70 |
| | Photosensitive resin (C-1) | | 85 | | | | | |
| | Photosensitive resin (C-2) | | | 18 | | | | |
| | Photosensitive resin (C-3) | | | | 27 | | | |
| | Photosensitive resin (C-4) | | | | | 45 | | |
| | 2-Methyl-[4-(methylthio)-phenyl]-2-morpholino-propane-1-one | 7 | 7 | 7 | 7 | 7 | 7 | 7 |
| | 2,4-Diethylthioxanthone | 1 | 1 | 1 | 1 | 1 | 1 | 1 |
| | Melamine | 2 | 2 | 2 | | | 2 | 2 |
| | $C_{11}Z$-A* | | | | 2 | 2 | | |
| | Phthalocyanine Green | 1 | 1 | 1 | 1 | 1 | 1 | 1 |
| | Talc | 9 | 9 | 9 | 9 | 9 | 9 | 9 |
| | Barium sulfate | 12 | 12 | 12 | 12 | 12 | 12 | 12 |
| | Silicon oxide | 21 | 21 | 21 | 21 | 21 | 21 | 21 |
| B | ESLV-80XY** | 35 | 35 | 35 | | | | |
| | ESLV-90CR*** | | | | 35 | 35 | | |
| | 1,3,5-Triglycidyl isocyanurate | | | | | | 35 | |
| | Bixylenyl glycidyl ether | | | | | | | 35 |
| | Resin (D-1) | 15 | 15 | 15 | 15 | 15 | 15 | 15 |
| | Dipentaerythritol hexaacrylate | 10 | 10 | 10 | 10 | 10 | 10 | 10 |
| | Barium sulfate | 40 | 40 | 40 | 40 | 40 | 40 | 40 |
| | Carbitol acetate | 5 | 5 | 5 | 5 | 5 | 5 | 5 |
| | Solvesso 150 | 5 | 5 | 5 | 5 | 5 | 5 | 5 |

*Trade name of a product manufactured by Shikoku Chemicals Corp.
**Trade name of a product manufactured by Nippon Steel Chemical Co., Ltd.
***Trade name of a product manufactured by Nippon Steel Chemical Co., Ltd.

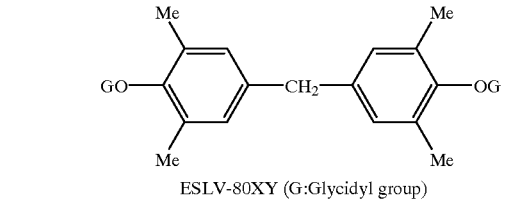

ESLV-80XY (G:Glycidyl group)

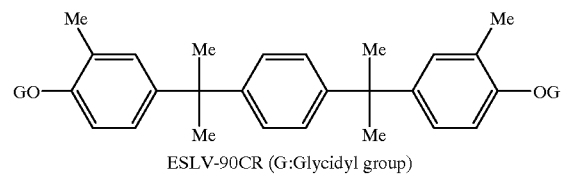

ESLV-90CR (G:Glycidyl group)

TABLE 4

| | | Example | | | | | Comparative Example | |
|---|---|---|---|---|---|---|---|---|
| Characteristic property | | 1 | 2 | 3 | 4 | 5 | 1 | 2 |
| Developability* | | Good | Good | Good | Good | Good | Good | Good |
| Adhesiveness** | | Good | Good | Good | Good | Good | Good | Good |
| Solder heat resistance*** | | Good | Good | Good | Good | Good | Good | Good |
| Resistance to PCT**** | | | | | | | | |
| After 48 hrs. | Appearance | Good | Good | Good | Good | Good | Swelling | Swelling |
| | Adhesiveness | Good | Good | Good | Good | Good | Inferior | Inferior |

TABLE 4-continued

| | Example | | | | | Comparative Example | |
|---|---|---|---|---|---|---|---|
| Characteristic property | 1 | 2 | 3 | 4 | 5 | 1 | 2 |
| After 120 hrs. Appearance | Good | Good | Good | Good | Good | Whitening with swelling | Whitening with swelling |
| Adhesiveness | Good | Good | Good | Good | Good | Inferior | Inferior |

*Undeveloped residue in the unexposed area was visually examined.
**Tested according to JIS D 0202 (cross-cut test, 1 × 1 mm squares, 100 squares)
***Change of appearance was visually examined after dipping test piece three times in a solder bath kept at 260° C. each for 10 seconds according to JIS C 6481.
****Pressure cooker test; After allowing test piece to stand in steam (121° C., 2 atmospheres) for a prescribed period of time, appearance of the film was visually examined, and then a cross-cut test was carried out in the same manner as above.

The photosensitive resin composition of the present invention is excellent in adhesiveness, heat resistance, resistance to PCT, and developability, and suitable for use as a solder resist composition for manufacture of LSI packages, etc.

What is claimed is:

1. A photosensitive resin composition comprising
(A) a carboxyl group-containing photosensitive resin,
(B) an epoxy curing agent represented by the following formula (I):

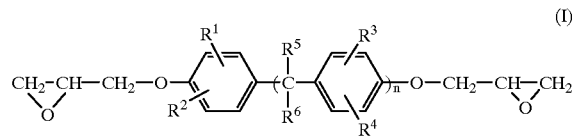

wherein $R^1$, $R^2$, $R^3$ and $R^4$ are independently a hydrogen atom, an alkyl group having 1 to 4 carbon atoms or an aryl group having 6 to 10 carbon atoms, provided that at least one of $R^1$, $R^2$, $R^3$ and $R^4$ is an alkyl group having 1 to 4 carbon atoms or an aryl group having 6 to 18 carbon atoms; $R^5$ and $R^6$ are independently a hydrogen atom or an alkyl group having 1 to 2 carbon atoms; and n is 0, 1, 2 or 3, and
(C) a photopolymerization initiator.

2. A photosensitive resin composition according to claim 1, wherein the carboxyl group-containing photosensitive resin has an acid value in the range of 40–250 KOH mg/g.

3. A photosensitive resin composition according to claim 2, wherein said acid value is in the range of 50–150 KOH mg/g.

4. A photosensitive resin composition according to claim 1, wherein at least 50% by weight of said epoxy curing agent, is the epoxy curing agent represented by said formula (I).

5. A photosensitive resin composition comprising:
(A) a carboxyl group-containing photosensitive resin;
(B) an epoxy curing agent represented by the following formula (I):

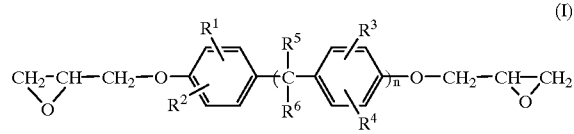

wherein $R^1$, $R^2$, $R^3$, and $R^4$ are independently a hydrogen atom, an alkyl group having 1 to 4 carbon atoms or an aryl group having 6 to 10 carbon atoms, provided that at least one of $R^1$, $R^2$, $R^3$ and $R^4$ is an alkyl group having 1 to 4 carbon atoms or an aryl group having 6 to 18 carbon atoms; $R^5$ and $R^6$ are independently a hydrogen atom or an alkyl group having 1 to 2 carbon atoms; and n is 0, 1, 2 or 3;
(C) a photopolymerization initiator; and
(D) a triazine compound.

6. A photosensitive resin composition comprising:
(A) a carboxyl group-containing photosensitive resin, wherein said carboxyl group-containing photosensitive resin (A) is an addition product formed by esterifying an epoxy compound (a) with an unsaturated monocarboxylic acid to obtain an esterified product and then adding an acid anhydride of a saturated or unsaturated polybasic acid to said esterified product;
(B) an epoxy curing agent represented by the following formula (I):

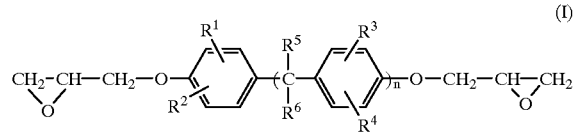

wherein $R^1$, $R^2$, $R^3$, and $R^4$ are independently a hydrogen atom, an alkyl group having 1 to 4 carbon atoms or an aryl group having 6 to 10 carbon atoms, provided that at least one of $R^1$, $R^2$, $R^3$ and $R^4$ is an alkyl group having 1 to 4 carbon atoms or an aryl group having 6 to 18 carbon atoms; $R^5$ and $R^6$ are independently a hydrogen atom or an alkyl group having 1 to 2 carbon atoms; and n is 0, 1, 2 or 3; and
(C) a photopolymerization initiator.

7. A photosensitive resin composition according to claim 6, wherein said epoxy compound (a) is an epoxy compound formed by reacting epichlorohydrin with a reaction product formed between salicylaldehyde and phenol or cresol.

8. A photosensitive resin composition according to claim 6, wherein said epoxy compound (a) is an epoxy compound having a polyamide unit and/or a polyamide-imide unit in the molecular structure thereof.

9. A photosensitive resin composition according to claim 8, wherein said epoxy compound (a) is an epoxy group-containing polyimide resin or an epoxy group-containing polyamide-imide resin obtained by reacting a carboxyl group-terminated polyamide resin and/or a carboxyl group-terminated polyamide-imide resin (b) with an epoxy resin (c) under a condition that the molar ratio of the epoxy group of (c) to the carboxyl group of (b) is greater than 1.

10. A photosensitive resin composition according to claim 6, wherein said epoxy compound (a) is an epoxy group-containing polyamide resin or an epoxy group-containing polyamide-imide resin obtained by reacting a carboxyl group-terminated polyamide resin and/or a carboxyl group-terminated polyamide-imide resin (b) with an epoxy resin (c) under a condition that the molar ratio of the epoxy group of (c) to the carboxyl group of (b) is greater than 1.

11. A photosensitive resin composition according to claim 10, wherein said carboxyl group-terminated polyamide resin and/or carboxyl group-containing polyamide-imide resin (b) is a resin having a polyalkylene oxide unit and/or a polycarbonate unit in the molecular structure thereof.

12. A photosensitive resin composition comprising (A) a carboxyl group-containing photosensitive resin, (B) an epoxy curing agent represented by the following formula (I):

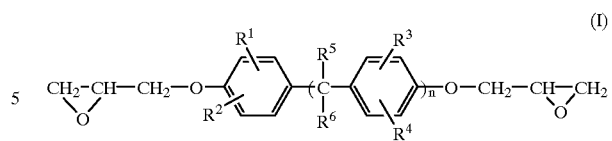

wherein $R^1$, $R^2$, $R^3$ and $R^4$ are independently a hydrogen atom, an alkyl group having 1 to 4 carbon atoms or an aryl group having 6 to 10 carbon atoms, provided that at least one of $R^1$, $R^2$, $R^3$ and $R^4$ is an alkyl group having 1 to 4 carbon atoms or an aryl group having 6 to 18 carbon atoms; $R^5$ and R6 are independently a hydrogen atom or an alkyl group having 1 to 2 carbon atoms; and n is 1, and (C) a photopolymerization initiator.

* * * * *